United States Patent
Chan

(10) Patent No.: US 8,989,530 B2
(45) Date of Patent: Mar. 24, 2015

(54) OPTOELECTRONIC MODULES AND SUBMOUNT FOR SAME AND A METHOD FOR MANUFACTURING AN ARRAY OF OPTICAL DEVICES

(75) Inventor: Seng-Kum Chan, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 412 days.

(21) Appl. No.: 12/841,927

(22) Filed: Jul. 22, 2010

(65) Prior Publication Data

US 2012/0020610 A1    Jan. 26, 2012

(51) Int. Cl.
| | |
|---|---|
| G02B 6/12 | (2006.01) |
| H01S 5/42 | (2006.01) |
| H01S 5/00 | (2006.01) |
| H01S 5/02 | (2006.01) |
| H01S 5/022 | (2006.01) |

(52) U.S. Cl.
CPC ............... *H01S 5/423* (2013.01); *H01S 5/0042* (2013.01); *H01S 5/0202* (2013.01); *H01S 5/02236* (2013.01); *H01S 5/02268* (2013.01); *H01S 5/02276* (2013.01); *H01L 2224/48091* (2013.01)
USPC .......................... 385/14; 257/E33.077; 438/33

(58) Field of Classification Search
None
See application file for complete search history.

(56) References Cited

U.S. PATENT DOCUMENTS

| 3,622,906 | A | * | 11/1971 | Nyul ................................ 257/88 |
|---|---|---|---|---|
| 5,828,683 | A | * | 10/1998 | Freitas ............................ 372/36 |
| 5,987,043 | A | * | 11/1999 | Brown et al. ................... 372/36 |
| 6,240,116 | B1 | | 5/2001 | Lang et al. |
| 6,396,857 | B1 | | 5/2002 | Labranche et al. |
| 7,116,690 | B2 | * | 10/2006 | Klimek ........................... 372/35 |
| 2001/0006568 | A1 | * | 7/2001 | Copner et al. .................. 385/16 |
| 2003/0118288 | A1 | | 6/2003 | Korenaga et al. |
| 2004/0061346 | A1 | * | 4/2004 | Capewell ..................... 294/64.1 |
| 2004/0179793 | A1 | | 9/2004 | McColloch |
| 2004/0218875 | A1 | | 11/2004 | Lemoff et al. |
| 2004/0241892 | A1 | | 12/2004 | Colgan et al. |
| 2005/0254539 | A1 | * | 11/2005 | Klimek ..................... 372/50.12 |

(Continued)

FOREIGN PATENT DOCUMENTS

WO    WO2006134675 A1    12/2006

OTHER PUBLICATIONS

Rosenberg et al., The PONI-1 Parallel-Optical Link, 1999 IEEE Electronic Components and Technology Conference, pp. 763-769.*

(Continued)

*Primary Examiner* — Andrew Jordan

(57) ABSTRACT

An array of optical devices includes singlets diced or separated from a first diced surface and a second diced surface of a semiconductor wafer. Each singlet includes a single optical emitter or a single photosensitive semiconductor device. The singlets are identified as operationally fit before being arranged in corresponding features in a receiving region of a submount. The corresponding features of the submount are arranged to align and precisely control the pitch or separation distance between optical portions of a desired number of singlets. The use of operationally fit singlets dramatically increases production efficiency as it is no longer necessary to identify N contiguous operational optical devices in a semiconductor wafer to produce a precisely aligned array of N operational optical devices.

20 Claims, 9 Drawing Sheets

(56) References Cited

U.S. PATENT DOCUMENTS

2006/0018607 A1* 1/2006 Rosenberg ............... 385/92
2007/0116070 A1* 5/2007 Schulte et al. ............ 372/36
2007/0147460 A1* 6/2007 Wang et al. .............. 372/101
2012/0020610 A1* 1/2012 Chan ........................ 385/14

OTHER PUBLICATIONS

Conk, Ryan D., Fabrication Techniques for Micro-Optical Device Arrays, Air Force Institute of Technology, Mar. 2002, Wright-Patterson Air Force Base, Ohio.

* cited by examiner

LEGEND

☐ HARVESTED 12 UNIT OPTICAL ARRAY

☒ INOPERABLE OPTICAL DEVICE

▨ DISCARDED OPERABLE OPTICAL DEVICE

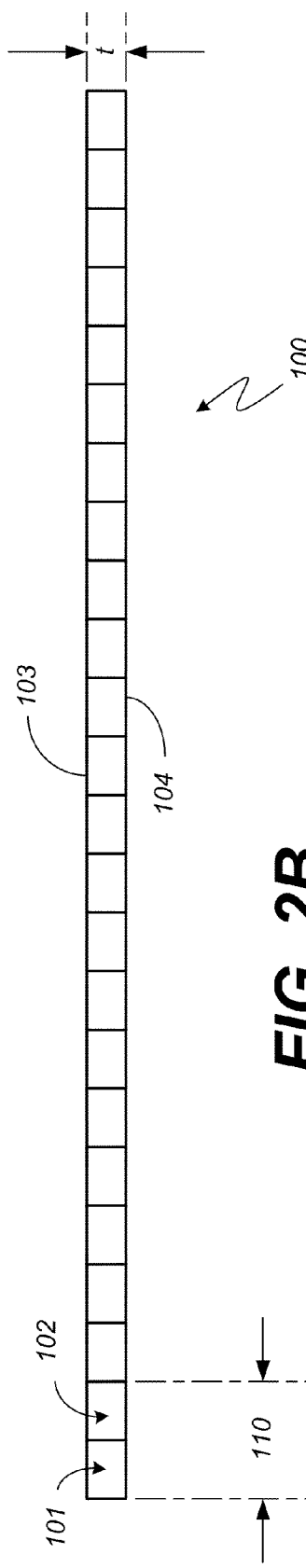
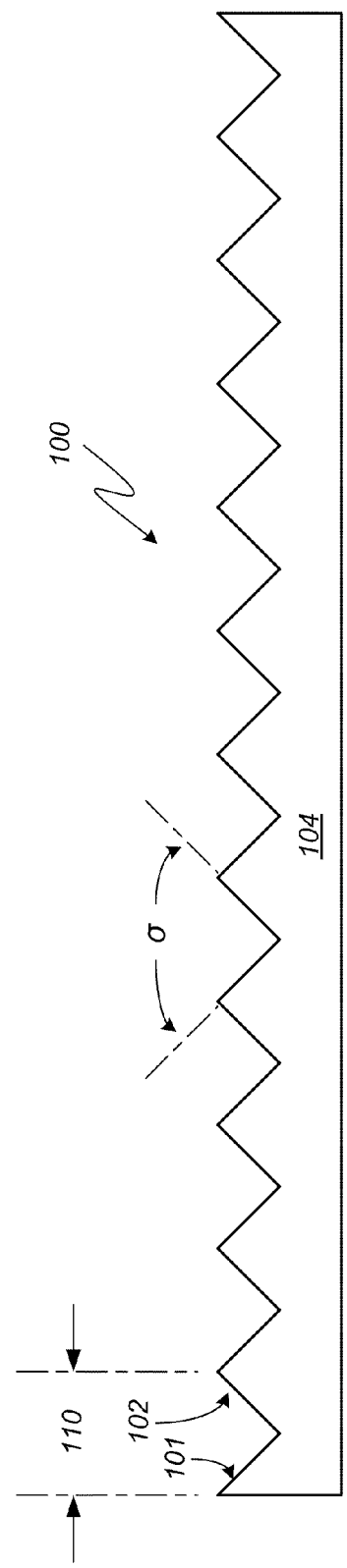

OPTOELECTRONIC MODULES AND SUBMOUNT FOR SAME AND A METHOD FOR MANUFACTURING AN ARRAY OF OPTICAL DEVICES

BACKGROUND

The present invention relates generally to optoelectronic communication systems and, more particularly, to an integrated optoelectronic module for parallel optical communication links.

There are many well-recognized benefits of using optical communication links to replace copper wiring in high data rate electronic systems such as computer systems, switching systems, and networking systems. Such potential benefits include increasing bandwidth and data rate, avoiding electromagnetic interference, limiting radiated electromagnetic noise from the system, reducing latency by placing optical/electrical (OLE) conversion as close as possible to the signal originating circuits (e.g., computer processors), increasing package density at lower cost per pin, among others.

At present, conventionally fabricated optoelectronic transducers typically include light emitting devices such as a Vertical Cavity Surface Emitting Laser (VCSEL) configured in a laser array, as well as light detecting devices such as photodiodes configured in a photodiode (PD) array. These optoelectronic transducers will often include devices precisely arranged as a result of the scale and accuracy of photolithographic processes used to produce the individual semiconductors.

Manufacturing lines for integrated circuits are inherently imperfect and invariably introduce defects into devices constructed on a wafer of semiconductor material. FIG. 1 illustrates a yield problem that results from six inoperable optical devices on a wafer 10 when it is desired to produce a 12-unit array. Each square on the surface 14 of the wafer 10 represents an instance of a semiconductor-based optical device. Devices marked with an "X" have a defect that renders the semiconductor device inoperable for its intended purpose. As a result of the defects, the desired number of elements in the array, and the fact that the wafer dicing process is performed by a rotating blade attached to a linearly translating carrier, only a limited number of such arrays can be produced from a single wafer.

In the example, devices marked in grayscale are individual members of a 12-device optical array that can be diced or separated from the wafer 10. Devices marked with a cross-hatch pattern are operable semiconductor devices that are discarded because they are not a member of a string of 12 contiguous semiconductor devices. FIG. 1 reveals that for the example wafer 10, relative device size, error rate and location, an error rate of less than 2% (or 6 inoperable devices out of 336 total devices on the wafer) results in a yield of 13 arrays (156 devices out of 336) for a yield rate of only 46.4%. Stated another way, about 51.8% of the operable devices on the wafer 10 are discarded (174 devices out of 336 total devices) because they are not in a row of 12 contiguous operable devices.

A need exists for an optoelectronic module that can be manufactured at relatively low costs with optical devices arranged in precise alignment with each other.

SUMMARY

An embodiment of an optical module having a mounting surface for receiving an array of optical devices includes a sub-assembly, a mounting surface and an integrated circuit. The sub-assembly includes a submount and a desired number of operational singlets. The operational singlets include a first diced surface, a second diced surface, and an optical device. The submount is arranged with respective first and second surfaces that form a receiving region for aligning and maintaining a consistent separation between adjacent optical devices. The first surface of the submount abuts the first diced surface of a corresponding singlet. The second surface of the submount abuts the second diced of the corresponding singlet. The submount further includes a third surface that is substantially orthogonal to the first surface and the second surface. The third surface is used to support the sub-assembly along the mounting surface of the optical module. The integrated circuit is electrically coupled to the singlets.

An embodiment of a method for manufacturing an array of optical devices includes the steps of separating a desired number of operational singlets from a semiconductor wafer by forming a respective first diced surface and a respective second diced surface for each of the desired number of operational singlets, the first diced surface being approximately orthogonal to the second diced surface, arranging the respective first diced surface and the second diced surface of each of the operational singlets in close proximity to corresponding surfaces in a receiving region of a submount, the receiving region arranging the operational singlets by contacting the first diced surface and the second diced surface such that optical portions are aligned with a consistent separation distance between optical portions of adjacent operational singlets, applying an epoxy at an intersection of respective exposed surfaces of the operational singlets and the submount and curing the epoxy.

The figures and detailed description that follow are not exhaustive. The disclosed embodiments are illustrated and described to enable one of ordinary skill to make and use the optical modules. Other embodiments, features and advantages of the optical modules and methods for manufacturing the same will be or will become apparent to those skilled in the art upon examination of the following figures and detailed description. All such additional embodiments, features and advantages are within the scope of the systems and methods as defined in the accompanying claims.

BRIEF DESCRIPTION OF THE FIGURES

An optoelectronic module and a method for manufacturing an array of optical devices can be better understood with reference to the following figures. The components within the figures are not necessarily to scale, emphasis instead being placed upon clearly illustrating the principles of identifying operational singlets, separating and arranging respective singlets with receiving regions in a submount that precisely aligns an optical portion of each singlet in a linear array. Moreover, in the figures, like reference numerals designate corresponding parts throughout the different views.

FIGS. 2A-2C include schematic diagrams illustrating an embodiment of a submount for arranging a linear array of optical devices.

DETAILED DESCRIPTION

An array of optical devices is arranged such that optical devices within the array are in precise alignment with each other in a submount. The array is assembled from individual optical devices or singlets diced or otherwise separated from a semiconductor wafer. The singlets, which can be emitters or photosensitive devices, are confirmed as operationally fit for an intended application prior to being arranged in the submount. The singlets are precisely diced to form a first diced surface and a second diced surface. The first diced surface and the second diced surface are adjacent to each other and define a mounting angle. Corresponding surfaces of the submount are arranged to receive and precisely control the pitch or separation distance between optical portions of adjacent singlets placed in the submount. The submount can be arranged with respective surfaces to support a desired number of singlets in a linear array. Once the singlets are attached to the submount, the sub-assembly or linear array of optical devices can be integrated with support electronics in an optical module.

The use of operational singlets in forming arrays of optical devices dramatically decreases the number of devices that are scrapped during a conventional manufacturing process that identifies and uses N (an integer number of) contiguous operational optical devices separated as a group from a semiconductor wafer. With the disclosed approach, every operational device in the semiconductor wafer is available for use in an array and only inoperable singlets are discarded. Consequently, the disclosed approach increases the yield from a semiconductor wafer and reduces the cost of manufacturing such optical arrays.

Figure 1:
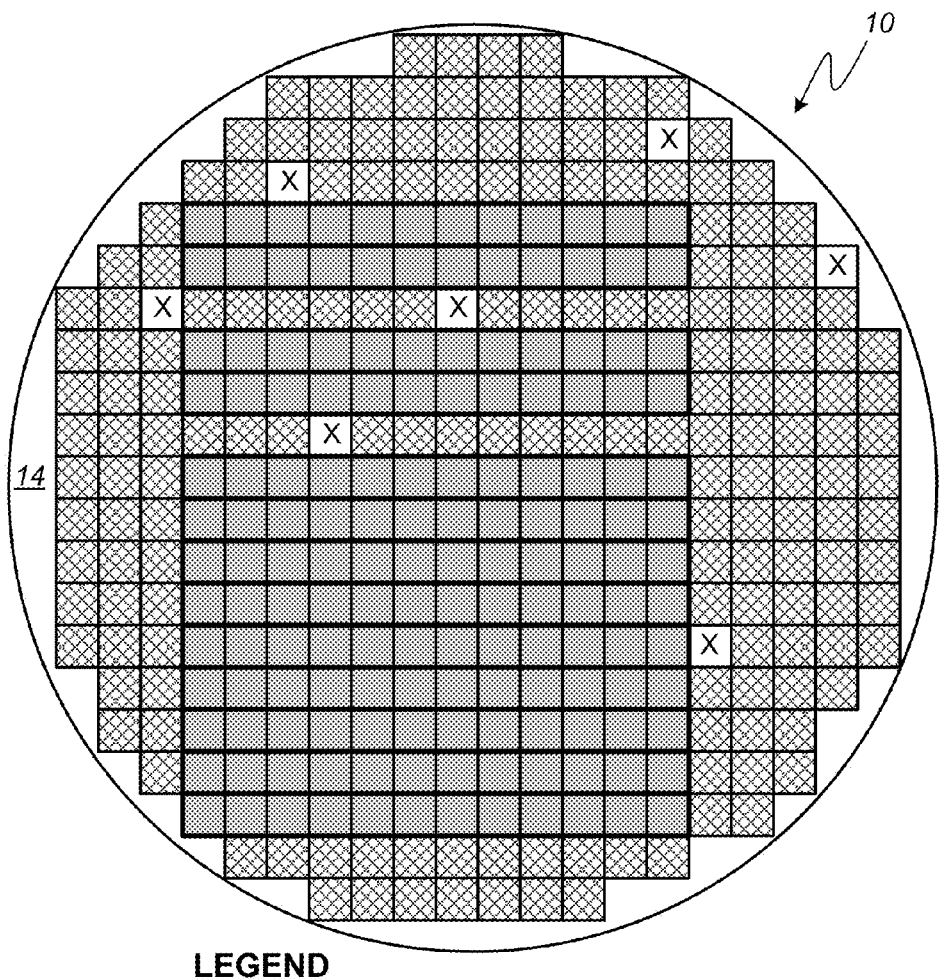
FIG. 1 is a schematic diagram illustrating how linear arrays are selected from a semiconductor wafer.
Figure 2A:
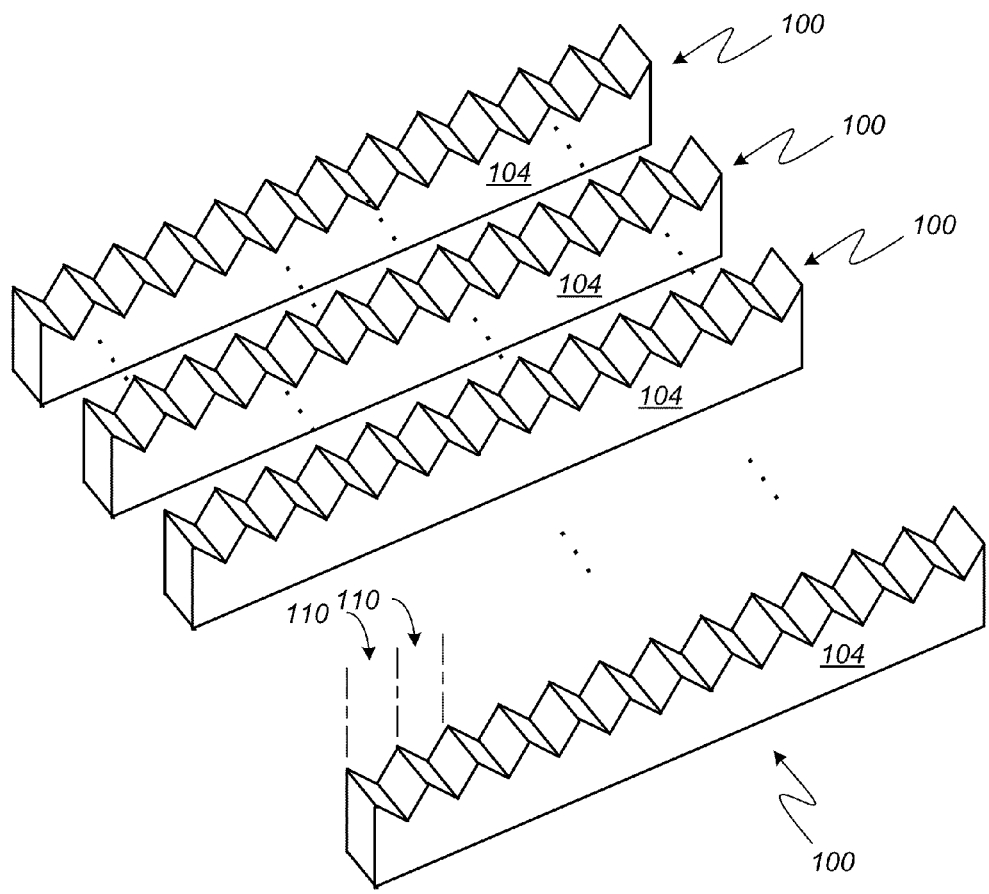

Turning now to the drawings, wherein like reference numerals designate corresponding parts throughout the drawings, reference is made to FIGS. 2A-2C, which illustrate an example embodiment of a submount for arranging a linear array of optical devices. As shown in FIG. 2A, a submount 100 includes a desired number of V-shaped channels or receiving regions 110 spread across the length of the submount 100. As depicted in FIG. 2A, each instance of the submount 100 can be diced or otherwise separated from a larger element In the example embodiment, the submount 100 includes 12 receiving regions. Alternative configurations with less than or more than 12 receiving regions are also contemplated. However arranged, the submount 100 is manufactured from any number of materials including but not limited to quartz, silicon, and optical glass.

As shown in FIG. 2B, the submount 100 includes a first surface 101 and an adjacent second surface 102 that define the receiving region 110. The first surface 101 opposes and intersects the second surface 102 at a base of the receiving region 100. The submount further includes a third surface that is substantially orthogonal to both the first surface 101 and the second surface 102 and a fourth surface 104 that opposes the third surface 103. As further shown in FIG. 2B, the third surface 103 is removed from the fourth surface 104 by a distance, t, representing a thickness of the submount 100.

As indicated in FIG. 2C, the first surface 101 and the second surface 102 define an angle, σ, of approximately 90 degrees in the receiving region 100. The submount 100 is manufactured such that the angle, σ, has a tolerance range of about 0.3 degrees.

Figure 3:
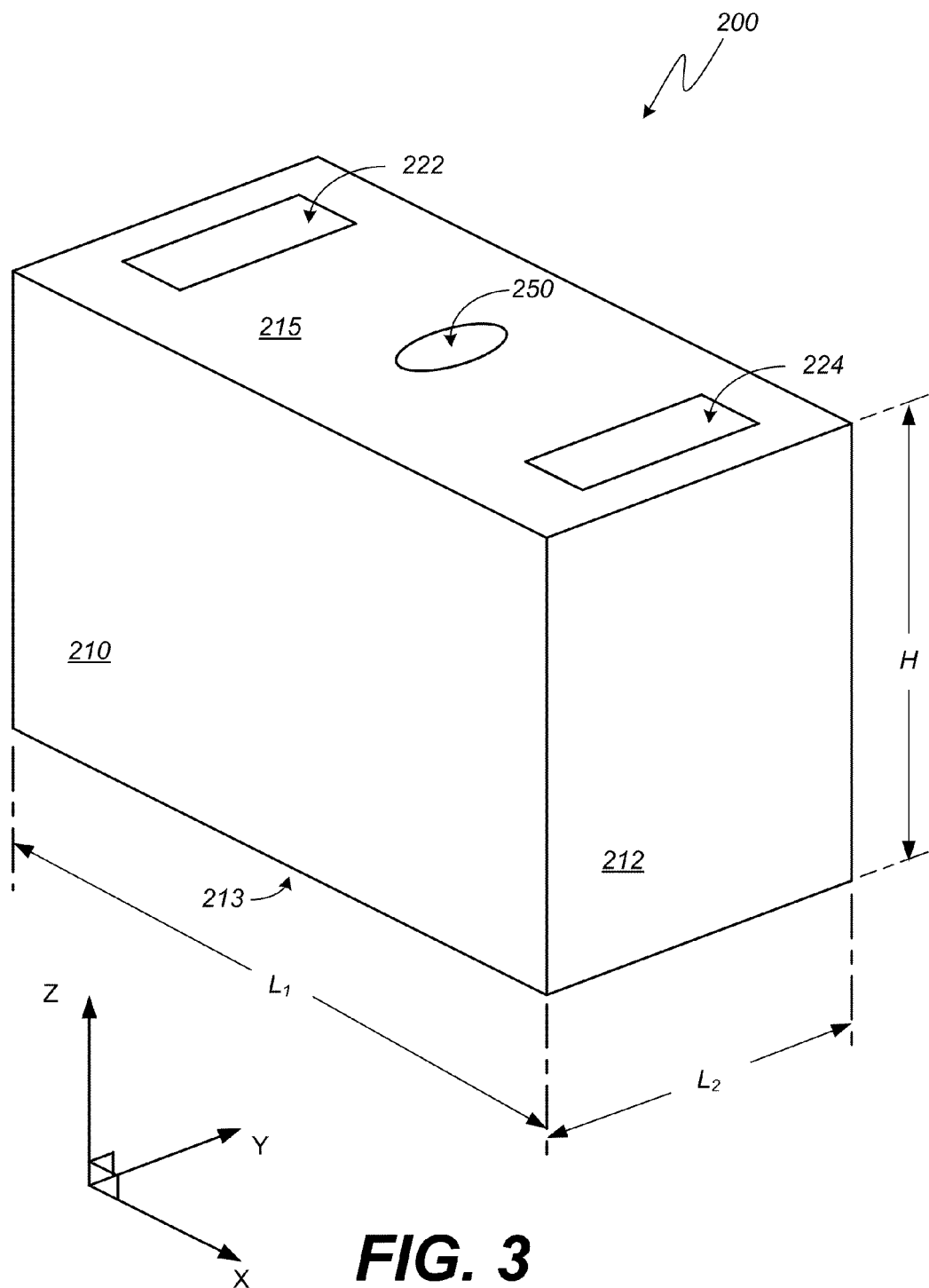
FIG. 3 is a schematic diagram illustrating an embodiment of a singlet.

FIG. 3 is a schematic diagram illustrating an example embodiment of a singlet 200. The singlet 200 is diced or otherwise separated from a wafer of semiconductor material. The singlet 200 can include an optical device 250 that emits light from a surface 215, such as a light-emitting diode or a VCSEL. Alternatively, the singlet 200 can include an optical device 250 that is sensitive or reacts in a defined manner to incident light upon a surface 215, such as a photosensitive diode. However arranged, the singlet includes a first electrical contact 222 and a second electrical contact 224 to electrically couple the singlet 200 to external electronic devices. The singlet 200 further includes a first diced surface 210 and a second diced surface 212. The first diced surface 210 is formed by a tool that precisely cuts, saws or otherwise machines a semiconductor wafer along a first direction or axis. The second diced surface 212 is formed by a tool that precisely cuts, saws or otherwise machines the semiconductor wafer along a second direction or axis. The first direction or axis is substantially orthogonal to the second direction. The first diced surface 210 has a length, $L_1$, along the first direction. The second diced surface 212 has a length, $L_2$, along the second direction. As indicated in FIG. 3, $L_1$ is greater (i.e., longer) than $L_2$. The singlet 200 is further characterized by a height, H, which is determined by the thickness of the semiconductor wafer from which the singlet 200 is removed after any polishing and or grinding of the non-active surface 213. The height, H, of the singlet 200 is greater in length than the thickness, t, of the submount 100.

Figure 4A:
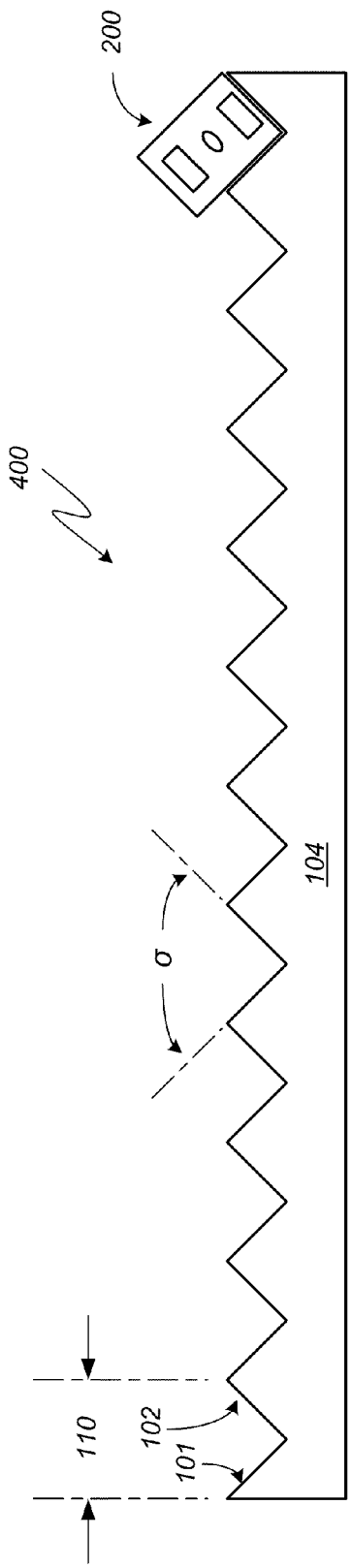
FIGS. 4A-4C include schematic diagrams illustrating a method of assembling a linear array using the submount of FIGS. 2B and 2C and a plurality of singlets.
Figure 4B:
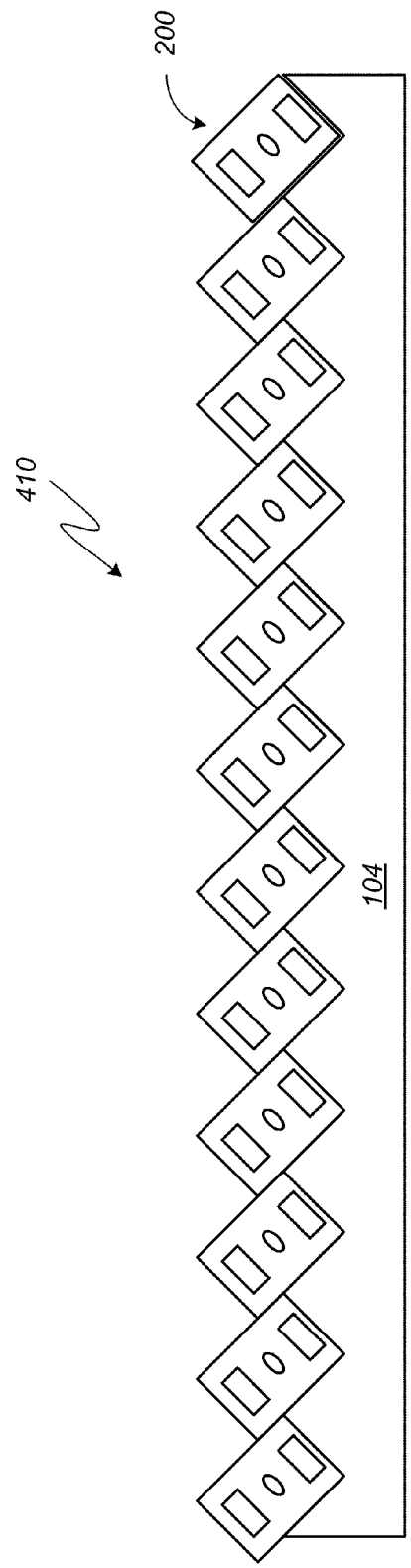

As indicated in FIG. 4A, the singlet 200 is placed in registration within a receiving region 110 of the submount 100. The first diced surface 210 is placed in proximity to the first surface 101 of the submount 100. The second diced surface 212 is placed in close proximity to the second surface 102 of the submount 100. As indicated in FIG. 4B a corresponding instance of an operational singlet 200 is placed in registration within each of the remaining receiving regions 110 of the submount 100. As long as the first diced surface 210 of each of the respective singlets 200 is formed in such a manner that the distance between the diced surface 210 and the center of the optical device 250 is constant and as long as the second diced surface 212 is formed such that the distance between the second diced surface 212 and the center of the optical device 25o is constant, each of the optical devices 250 will be closely aligned as a result of placement of the respective singlets 200 in the submount 100.

Figure 4C:
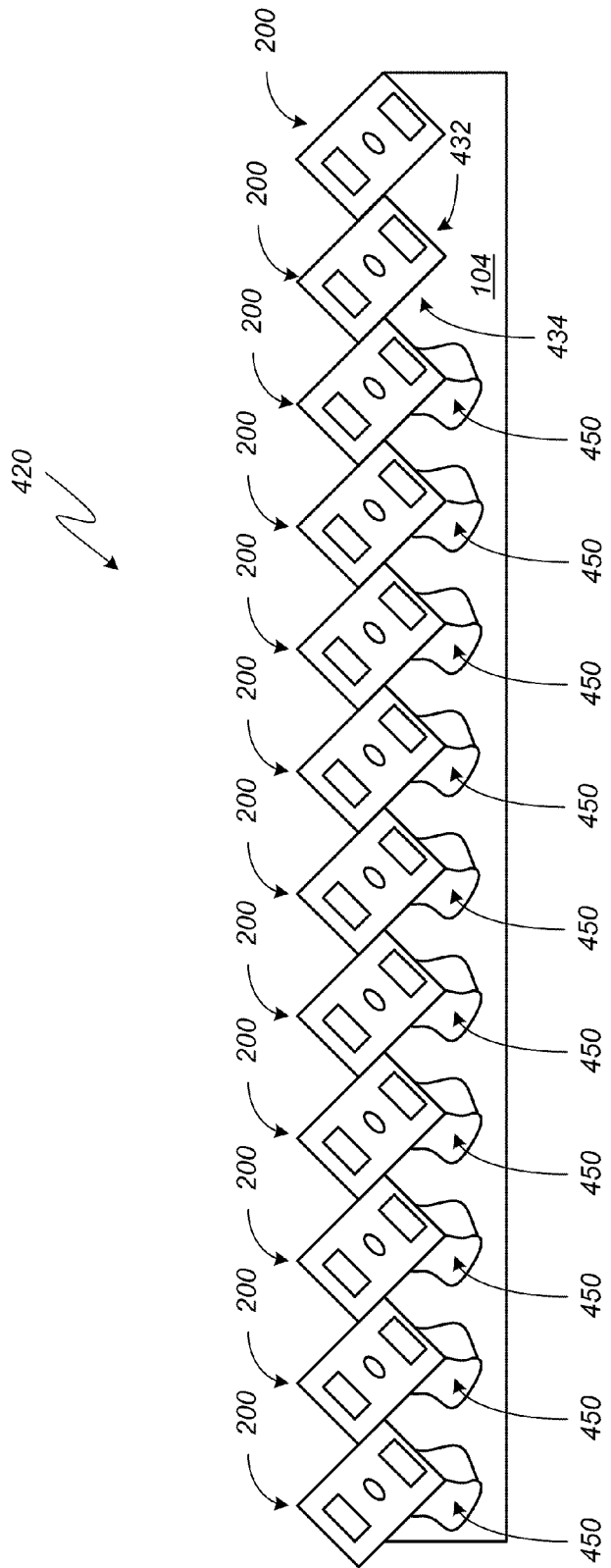

FIG. 4C illustrates a sub-assembly 420 that includes the submount 100 and twelve instances of singlets 200 arranged as explained above in corresponding receiving regions of the submount. Alternative embodiments having less or more than twelve singlets 200 in a linear array are contemplated. As illustrated in FIG. 4C, epoxy 450 is introduced near the intersection 434 of an exposed portion of a first diced surface 210 and the surface 104 of the submount 100. Epoxy 450 is further introduced near the intersection 432 of an exposed portion of the second diced surface 212 and the surface 104 of the submount 100. When ultraviolet reactive epoxy is used, the epoxy 450 may be exposed to ultraviolet light until cured.

Figure 5:
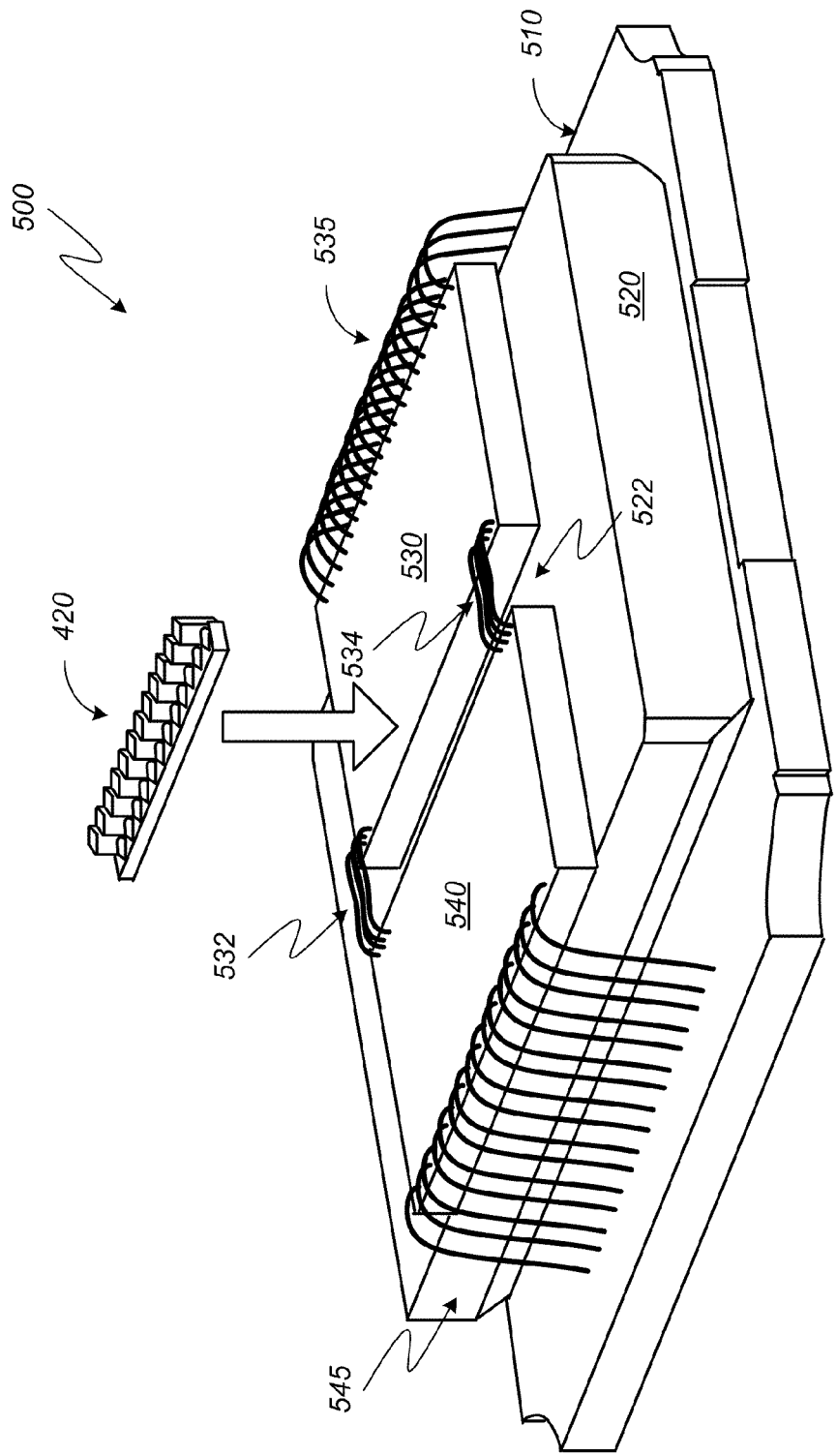
FIG. 5 is a schematic diagram illustrating an embodiment of an optoelectronic module produced with the linear array of FIG. 4C.

FIG. 5 is a schematic diagram illustrating an embodiment of an optoelectronic module 500 produced with the sub-assembly 420 of FIG. 4C. Once each of the epoxy joints have drawn the respective diced surfaces of the singlets 200 into abutment with the corresponding first and second surfaces of the respective receiving regions 110 and the epoxy has cured, the sub-assembly 420 is arranged in registration with a mounting surface 522 of an electronic sub-assembly 500. In the example embodiment, the electronic sub-assembly 500 includes a stacked arrangement with a first integrated circuit 530 and a second integrated circuit 540 arranged along an upper surface of a heat sink 520 that is attached to a printed circuit board 510. The printed circuit board 510 provides power, electrical ground and various signal paths to the integrated circuit 530 via wirebonds 535. The printed circuit board 510 provides power, ground and various signal paths to the integrated circuit 540 via wirebonds 545. When the singlets 200 of the sub-assembly 420 are VCSELs, the integrated circuit 530 and the integrated circuit 540 include circuits to control the operation of a subset of the VCSELs. Operation of each of the VCSELs is coordinated between the integrated circuit 530 and the integrated circuit 540 by way of a first bus of wire bonds 532 and a second bus of wirebonds 534 that connect the integrated circuits to each other. As shown by the downward facing arrow, the sub-assembly 420 is arranged on the mounting surface 522 in a gap between the integrated circuit 530 and the integrated circuit 540.

Figure 6:
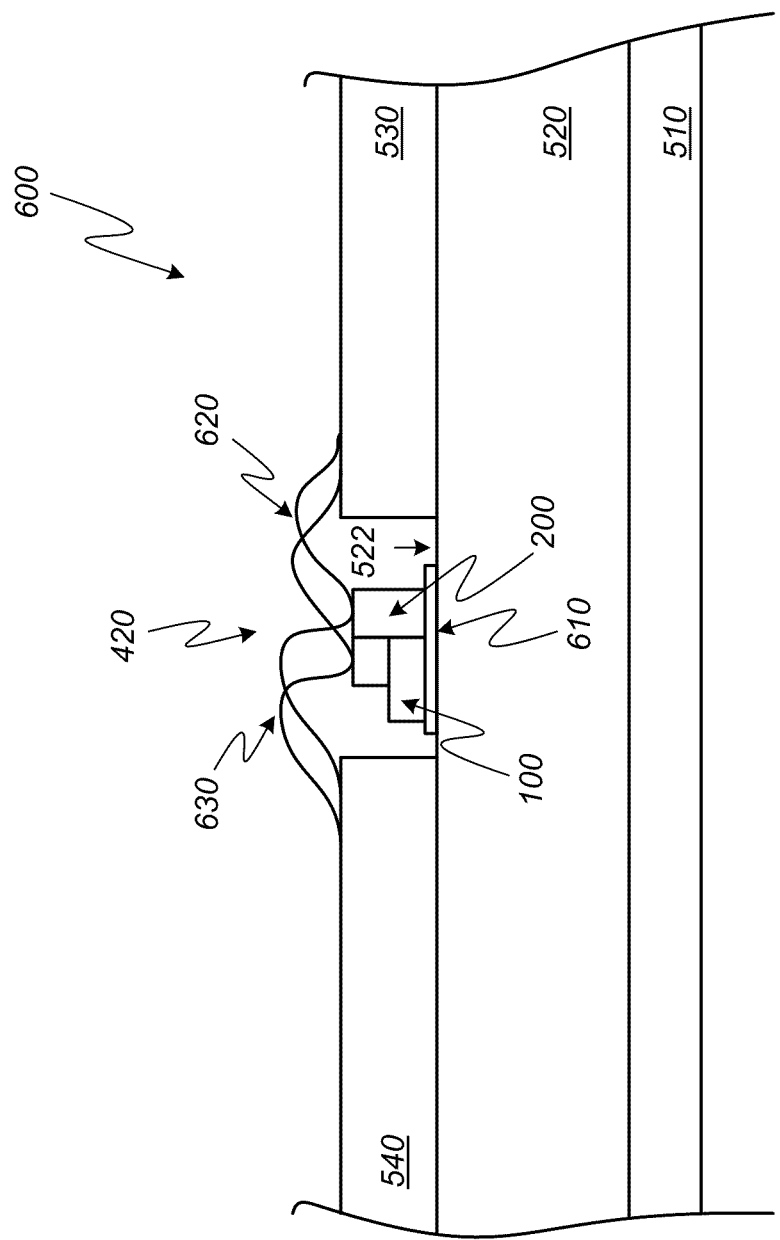
FIG. 6 is a schematic diagram illustrating details of the optoelectronic module of FIG. 5.

FIG. 6 is a schematic diagram illustrating details of an example optoelectronic module 600 which includes the electronic sub-assembly 500 of FIG. 5 and the sub-assembly 420. Only the center of the optoelectronic module 600 is observable in FIG. 6 and the first bus of wirebonds 532 and second bus of wirebonds 534 have been removed for clarity. As shown in FIG. 6, an adhesive layer or epoxy 610 is introduced along the mounting surface 522 of the heat sink 520 to physically attach the sub-assembly to the electronic sub-assembly 500. Thereafter, a first subset of the singlets 200 are electrically coupled to the integrated circuit 530 by a corresponding set of wirebonds 620. The remaining singlets 200 are electrically coupled to the integrated circuit 540 by wirebonds 630. In this arrangement, an emitting surface 215 of each of the singlets 200 is Substantially parallel to the mounting surface 522 and substantially orthogonal to each of The first diced surface 210, the second diced surface 212 and the third diced surface.

Figure 7:
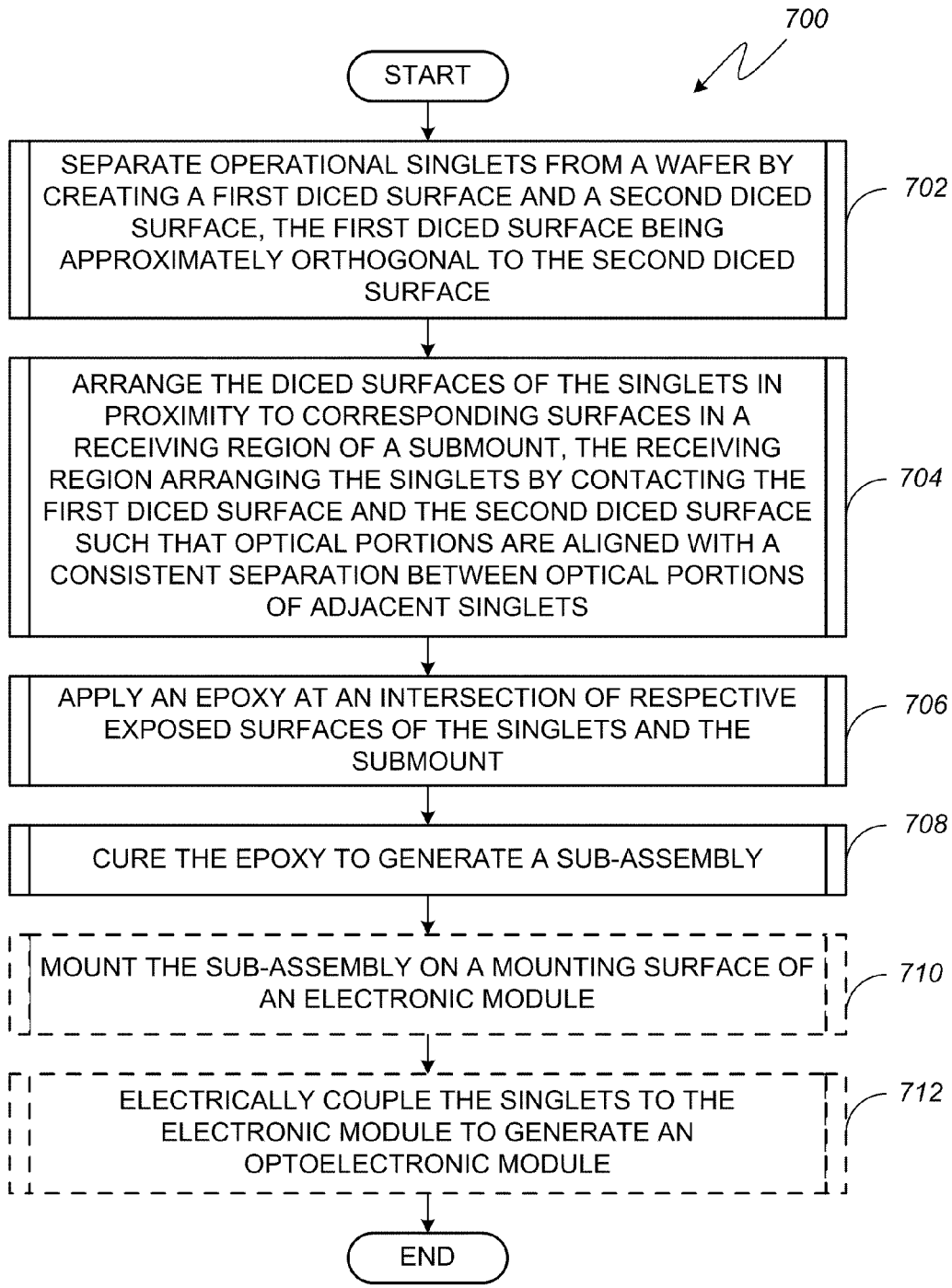
FIG. 7 is a flow diagram illustrating an embodiment of a method for manufacturing an array of optical devices.

FIG. 7 is a flow diagram illustrating an embodiment of a method 700 for manufacturing an array of optical devices. The method begins with block 702, where operational singlets 200 are separated from a semiconductor wafer by creating a first diced surface 210 and a second diced surface 212. As further indicated in block 702 the first diced surface 210 is substantially orthogonal to the second diced surface 212. The individual optical devices within the singlets 200 can be automatically probed when the devices are within the wafer. A test system generates a map of the operational singlets. Thereafter, all singlets can be separated from the wafer and inoperative singlets, as defined by the map, can be discarded and operational singlets 200 can be assembled with the submount 100 as follows.

In block 704, the diced surfaces of the singlets 200 are arranged in proximity to corresponding surfaces in a receiving region 110 of the submount 100. The receiving region 110 arranges the singlets 200 by contacting the first diced surface 210 and the second diced surface 212 such that the optical portion 250 of the singlet 200 are aligned and arranged with a consistent separation between adjacent singlets 200. Thereafter, as indicated in block 706, an epoxy is introduced or applied at an intersection of respective exposed surfaces of the singlets 200 and the submount 100. As explained above, the singlets 200 have a height that exceeds that of the submount 100. Consequently, a portion of the first diced surface 210 and a portion of the second diced surface 212 are exposed above the surface 104 of the submount 100. The epoxy 450 is applied along these surfaces. In block 708, the epoxy is cured to generate the sub-assembly 420. The epoxy may be cured by a timed exposure to ultraviolet light and/or thermal energy as may be required by material properties of the chosen epoxy.

Once the epoxy has cured, the sub-assembly 420 is ready for further assembly steps. Such additional processing steps can include mounting the sub-assembly 420 on a mounting surface 522 of an electronic module 500 and electrically coupling the singlets 200 of the sub-assembly 420 to the electronic module 500 to generate an optoelectronic module 600.

While various example embodiments of the optoelectronic module and methods for manufacturing an array of optical devices have been described, it will be apparent to those of ordinary skill in the art that many more embodiments and implementations are possible that are within the scope of this disclosure. Accordingly, the described sub-assemblies, modules and methods for manufacturing an array of optical devices are not to be restricted or otherwise limited except in light of the attached claims and their equivalents.

What is claimed is:

1. An optoelectronic module, comprising:
a heat sink having a first surface and a mounting surface opposed to the first surface;
a sub-assembly comprising a submount having a plurality of respective first and second surfaces that separately form a plurality of respective receiving regions for receiving optical devices comprising singlets, the first surface of the submount abutting and overlapping a portion of a first surface of a singlet over the entirety of the first surface of the submount, the second surface of the submount abutting and overlapping a respective portion of a second surface of the singlet over the entirety of the second surface of the submount, the first and second surfaces of the singlet extending beyond the first and second surfaces of the submount in a direction orthogonal to the mounting surface of the heatsink, such that for adjacent singlets arranged in the respective receiving regions a third surface of a first singlet abuts a portion of a first surface of a second singlet and such that the third surface of the first singlet lies entirely beyond the respective receiving region of the submount in a direction parallel to the mounting surface of the heat sink, the submount aligning and maintaining a consistent separation distance between adjacent optical elements in the respective singlets; and
at least one integrated circuit electrically coupled to the singlets.

2. The optoelectronic module of claim 1, wherein the plurality of first and second surfaces of the submount define an angle of approximately 90 degrees in the receiving region.

3. The optoelectronic module of claim 2, wherein the first and second surfaces of the submount define an angle having a tolerance range of about 0.3 degrees.

4. The optoelectronic module of claim 1, wherein the submount comprises a material selected from the group consisting of quartz, silicon, and optical glass.

5. The optoelectronic module of claim 1, wherein the submount has a thickness that is less than a height of the singlets, such that the submount does not interfere with a wirebond that electrically couples a contact on an exposed surface of the singlets to a corresponding contact on the at least one integrated circuit.

6. The optoelectronic module of claim 1, wherein the singlets are physically coupled to the submount by an epoxy applied along an exposed portion of the first surface of the singlets, an exposed portion of the second surface of the singlets and a fourth surface of the submount opposed to the third surface of the submount.

7. The optoelectronic module of claim 6, wherein as the epoxy is cured an unexposed portion of the first surface of the singlet closely contacts the first surface of the submount, an unexposed portion of the second surface of the singlet closely contacts the second surface of the submount.

8. The optoelectronic module of claim 1, further comprising:
an epoxy layer adjacent to the third surface of the submount, the non-active surface of the singlets and the mounting surface of the heat sink for stabilizing the subassembly to form a linear array of optical devices.

9. The optoelectronic module of claim 1, wherein at least one singlet comprises a VCSEL.

10. The optoelectronic module of claim 1, wherein at least one singlet comprises a photosensitive semiconductor device.

11. A method for manufacturing an array of optical devices, the method comprising:
separating a desired number of operational singlets from a semiconductor wafer by forming a respective first diced surface, a respective second diced surface and a respective third diced surface for each of the desired number of operational singlets from the semiconductor wafer, the first diced surface being approximately orthogonal to the second diced surface, the first diced surface being approximately parallel to the third diced surface;
arranging the respective first diced surface and the second diced surface of each of the operational singlets in close proximity to corresponding first and second surfaces in a respective receiving region of a submount, the receiving regions arranging the operational singlets by contacting a portion of a length of the first diced surface and an entire length of the second diced surface such that optical portions are aligned with a consistent separation distance between optical portions of adjacent operational singlets such that for adjacent operational singlets arranged in the submount, the third diced surface of a first singlet abuts a portion of the first diced surface of a second singlet and such that the third surface of the first singlet extends in a direction parallel to a mounting surface of the submount entirely beyond the respective receiving region of the submount and such that the first and second diced surfaces of respective operational singlets extend beyond a third surface of the submount in a direction orthogonal to a mounting surface of a heatsink opposed to the mounting surface of the submount;
applying an epoxy at an intersection of respective exposed surfaces of the operational singlets and the submount; and
curing the epoxy.

12. The method of claim 11, wherein the step of separating a desired number of operational singlets from a semiconductor wafer includes cutting along first and second axes.

13. The method of claim 12, wherein the cutting along the first and second axes is performed with respect to the optical portion within the operational singlet.

14. The method of claim 11, wherein the third surface of the submount is substantially orthogonal to the first and to the second surfaces of the submount, with a fourth surface of the submount opposed to the third surface of the submount.

15. The method of claim 11, wherein the step of separating a desired number of operational singlets from a semiconductor wafer includes forming a first diced surface that is longer in a first direction than a second diced surface is in a second direction orthogonal to the first direction.

16. The method of claim 11, further comprising:
exposing the epoxy to ultraviolet light to bond the operational singlets to the submount;
arranging a non-active surface of the operational singlets and the third surface of the submount on a mounting surface of a module; and
electrically coupling the operational singlets to the module.

17. The method of claim 16, wherein the step of arranging a non-active surface of the operational singlets and the third surface of the submount on a surface of the module comprises introducing an adhesive layer between the mounting surface of the module and the non-active surface of the operational singlets.

18. The method of claim 11, wherein at least one of the operational singlets comprises an emitter.

19. The method of claim 11, wherein at least one of the operational singlets comprises a photosensitive semiconductor device.

20. The method of claim 11, wherein the submount comprises a material selected from the group consisting of quartz, silicon, and optical glass.

* * * * *